(12) United States Patent
Howland, Jr. et al.

(10) Patent No.: US 7,007,408 B2
(45) Date of Patent: Mar. 7, 2006

(54) METHOD AND APPARATUS FOR REMOVING AND/OR PREVENTING SURFACE CONTAMINATION OF A PROBE

(75) Inventors: William H. Howland, Jr., Wexford, PA (US); James E. Healy, Jr., Carnegie, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 0 days.

(21) Appl. No.: 10/834,320

(22) Filed: Apr. 28, 2004

(65) Prior Publication Data

US 2005/0241175 A1     Nov. 3, 2005

(51) Int. Cl.
    *F26B 7/00*      (2006.01)
(52) U.S. Cl. ............................................. 34/389; 34/82
(58) Field of Classification Search .................. 34/389, 34/404, 474, 60, 61, 68, 82, 107, 187; 141/93, 141/98; 414/225, 935; 134/902
See application file for complete search history.

(56) References Cited

U.S. PATENT DOCUMENTS

| | | | | |
|---|---|---|---|---|
| 3,836,329 A | * | 9/1974 | Jordan | 436/49 |
| 4,548,020 A | * | 10/1985 | Rozmus et al. | 53/268 |
| 4,685,598 A | * | 8/1987 | Nezworski | 222/400.7 |
| 4,991,312 A | * | 2/1991 | Pambianchi | 34/534 |
| 5,724,748 A | * | 3/1998 | Brooks et al. | 34/90 |
| 5,777,241 A | * | 7/1998 | Evenson | 73/863.11 |
| 5,812,403 A | * | 9/1998 | Fong et al. | 700/121 |
| 5,837,193 A | * | 11/1998 | Childers et al. | 422/28 |

* cited by examiner

*Primary Examiner*—Stephen Gravini
(74) *Attorney, Agent, or Firm*—The Webb Law Firm

(57) ABSTRACT

To remove and/or prevent contamination of a probe, at least a portion of the probe is positioned in a chamber having an inlet passage and an outlet passage, with a distal end of the probe extending through the outlet passage and terminating on a side thereof opposite the chamber. A gas is caused to flow through the inlet passage into the chamber and out the outlet passage, thereby modifying an environment surrounding the distal end of the probe. The gas may be heated prior to injection.

29 Claims, 4 Drawing Sheets

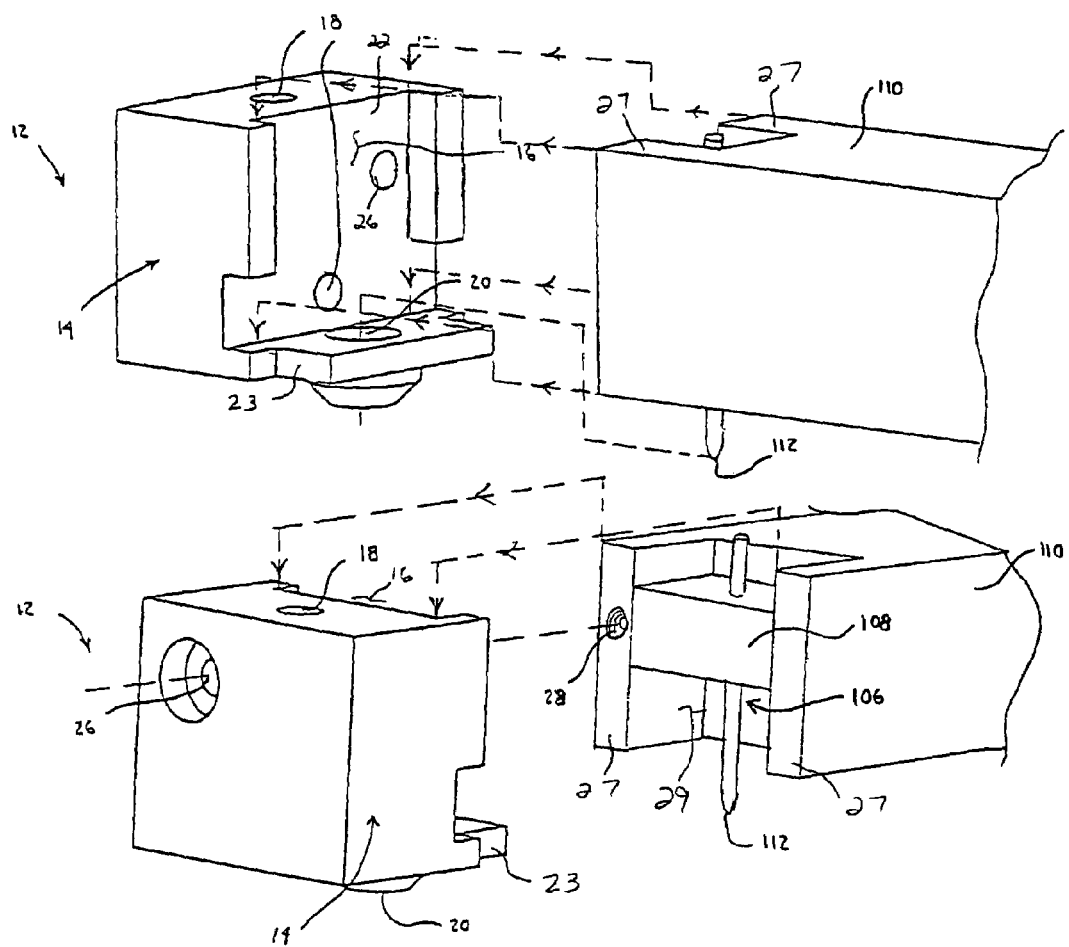

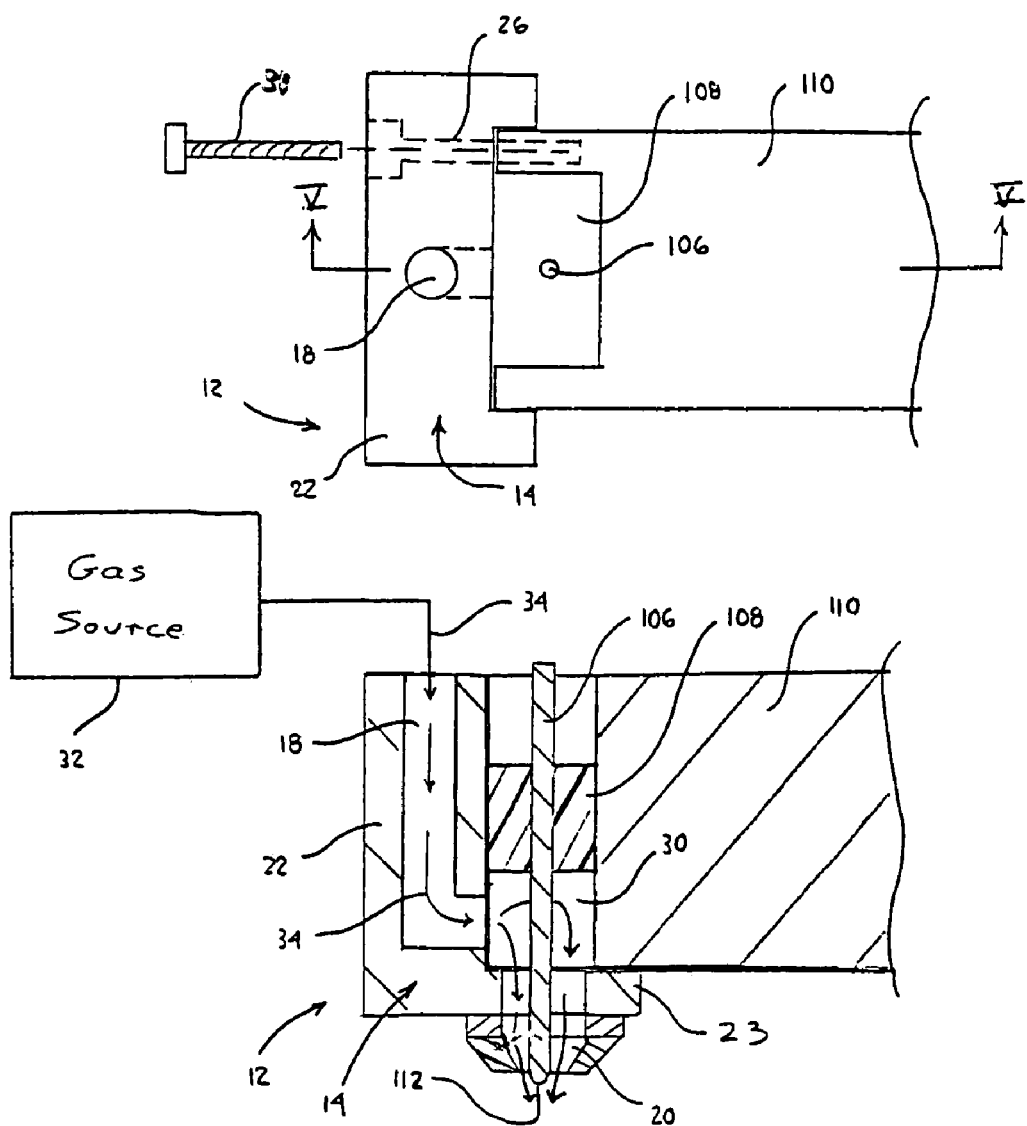

METHOD AND APPARATUS FOR REMOVING AND/OR PREVENTING SURFACE CONTAMINATION OF A PROBE

BACKGROUND OF THE INVENTION

1. Field of the Invention

The present invention relates generally to semiconductor wafer probes and, in particular, to a method and apparatus for removing and/or preventing contamination of a surface of the probe, typically around a working or distal end.

2. Description of Related Art

In the field of semiconductor manufacture, a semiconductor wafer must be tested to determine one or more of its electrical properties prior to or after the formation of integrated circuits thereon. An elastic metal gate (EM-gate) probe may be used to determine these electrical properties. Such a probe desirably includes an elastically deformable conductive tip for contacting a front surface of the semiconductor wafer. An electrical stimulus is applied between the elastically deformable conductive tip and the semiconductor wafer and a response is measured to the electrical stimulus. At least one electrical property of the dielectric and/or the semiconducting material of the semiconductor wafer is determined from this response. The conductive tip of the probe is formed from metal, such as tantalum, a conductive elastomer, a conductive polymer, etc.

One drawback to using an EM-gate probe is that a surface of the probe that contacts the semiconductor wafer may become contaminated. Such surface contamination is undesirable, since it adversely affects measurements. This contamination originates from the local and untreated atmosphere surrounding the probe, which is typically a mixture of numerous gases and gaseous vapors. Such vapors can condense on the probe surface and form a liquid or semi-liquid film. Although the constituents in the contamination layer are not precisely known, it is believed that water is a primary component. Other contaminants include various hydrocarbon molecules, which are typically referred to as organic contaminants.

SUMMARY OF THE INVENTION

It is an object of the present invention to provide a method and apparatus for removing and/or preventing surface contamination of a probe that overcomes the deficiencies of the prior art. It is another object of the present invention to provide a method and apparatus for removing and/or preventing surface contamination of a probe that does not affect the operation or measurement capabilities of the probe. It is a further object of the present invention to provide a method and apparatus for removing and/or preventing surface contamination of a probe that is capable of being retrofitted to existent probes and probe arm bodies.

The present invention is directed to a method of removing and/or preventing contamination of a surface of a probe. The method includes the steps of: (a) positioning at least a portion of the probe in a chamber having an inlet passage and an outlet passage with a distal end of the probe extending through the outlet passage and terminating on a side thereof opposite the chamber; and (b) causing a gas to flow through the inlet passage into the chamber and out of the outlet passage, thereby modifying an environment surrounding the distal end of the probe. In a preferred and non-limiting embodiment, the environment surrounding a portion of the surface of the probe is modified whereupon relative humidity is reduced, a contaminant is removed from the environment, water is evaporated and/or contaminated vapor is evaporated.

The present invention is also a method of removing and/or preventing contamination of a surface of a probe that includes the following steps: (a) positioning at least a portion of the probe in a chamber having an inlet passage and an outlet passage, with a working or distal end of the probe extending through the outlet passage and terminating on a side thereof opposite the chamber; (b) heating a gas; and (c) causing the gas to flow through the inlet passage into the chamber and out the outlet passage, thereby contacting the probe with the heated gas.

The present invention is also a system for removing and/or preventing contamination of a surface of a probe extending through an insulator and attached to a probe arm. The system includes a shroud. The shroud includes a body defining a wall. The wall, the insulator and the probe arm define a chamber through which at least part of the probe extends. An inlet passage extends through the wall and is in fluid communication with the chamber, and an outlet passage extends through a base of the body and is in fluid communication with the chamber. A gas source in fluid communication with the inlet passage causes a gas to flow through the inlet passage into the chamber.

The present invention is also a shroud that is used for removing and/or preventing contamination of a surface of a probe. The shroud includes a body defining a wall; an inlet passage extending through the wall and in fluid communication therewith; and an outlet passage extending through the wall of the body and in fluid communication therewith. The shroud is capable of engaging with a portion of a probe arm.

The present invention, both as to its construction and its method of operation, together with the additional objects and advantages thereof, will best be understood from the following description of exemplary embodiments when read in connection with the accompanying drawings.

BRIEF DESCRIPTION OF THE DRAWINGS

FIG. 2 is a perspective view of a shroud according to the present invention connected to a probe arm of the system shown in FIG. 1;

FIG. 3 is a further perspective view of the shroud and the probe arm of the system shown in FIG. 1;

FIG. 4 is a top-down plan view of the shroud of FIGS. 2 and 3 connected to the probe arm of the system shown in FIG. 1;

FIG. 5 is a sectional view taken along lines V—V in FIG. 4;

DETAILED DESCRIPTION OF THE INVENTION

Figure 1:
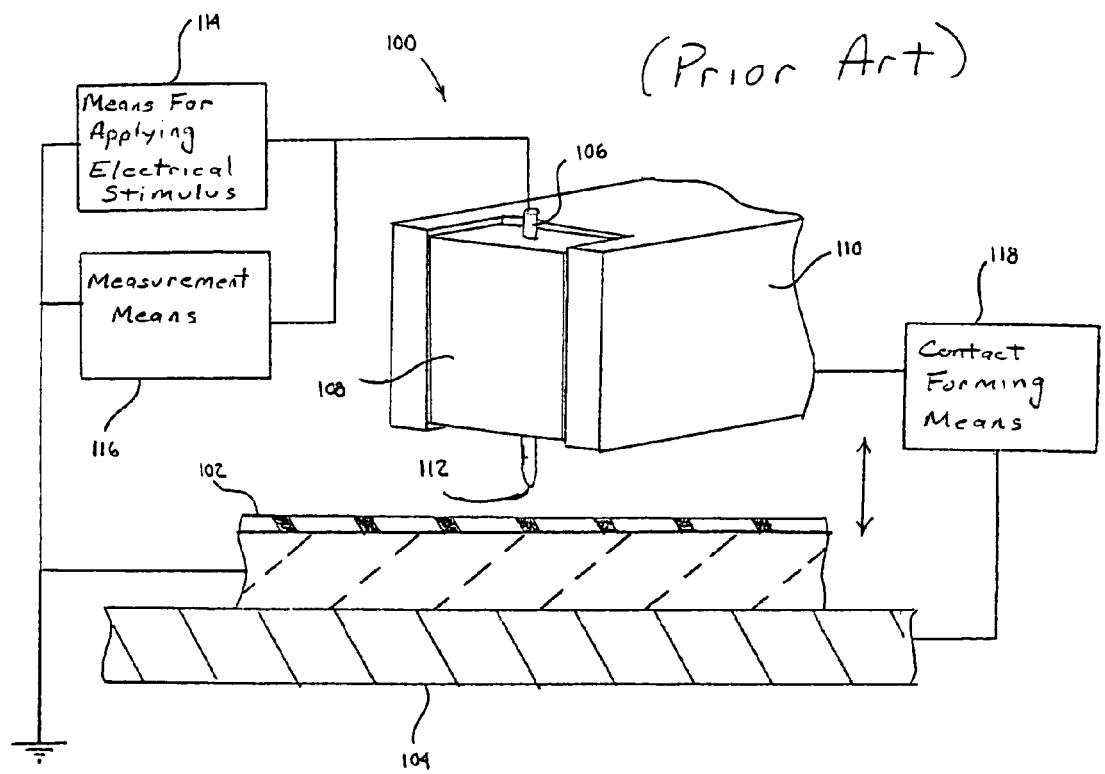
FIG. 1 is a schematic view of a prior art system for testing a semiconductor sample.

With reference to FIG. 1, a prior art system 100 utilized to analyze and perform measurements upon a semiconductor wafer or sample 102 includes a vacuum chuck 104 for supporting semiconductor wafer 102, a probe 106 extending through an insulator 108 supported by a probe arm 110.

Probe 106 includes a working or distal end 112 configured to contact semiconductor wafer 102.

System 100 includes a contact forming means 118 that is utilized to move distal end 112 of probe 106 into contact with a surface of semiconductor wafer 102 when it is supported by vacuum chuck 104. When distal end 112 of probe 106 is in contact with semiconductor wafer 102, a means for applying electrical stimulus 114 can apply a suitable electrical stimulus between probe 106 and semiconductor wafer 102, and a measurement means 116 can measure the response of semiconductor wafer 102 to the electrical stimulus.

With reference to the accompanying figures, the present invention is directed to a method and apparatus for removing and/or preventing contamination of the distal end 112 of probe 106 by means of a shroud 12 coupled to probe arm 110 adjacent insulator 108.

With reference to FIGS. 2–4, shroud 12 includes a body 14 that defines a recess or slot 16. An inlet passage 18 extends through a wall or face 22 of body 14 and is in fluid communication with slot 16. In addition, an outlet passage 20 extends through a base 23 of body 14 and is also in fluid communication with slot 16.

Body 14 includes an orifice 26 that extends therethrough in communication with slot 16. Probe arm 110 includes a pair of spaced arms 27 defining a slot 29 for receiving insulator 108 in a press fit relation between arms 27. One of arms 27 includes a female threaded orifice 28 having a longitudinal axis that aligns with a longitudinal axis of orifice 26 when shroud 12 and probe arm 110 are mated. A male threaded fastener 31 projected through orifice 26 can threadedly mate with female threads of orifice 28 to attach shroud 12 to probe arm 110. When shroud 12 is attached to probe arm 110, wall 22, base 23, insulator 108 and arms 27 define an open chamber 30, shown best in FIG. 5, surrounding a lower portion of probe 106. Comparing FIGS. 1 and 3, it can be seen that at least the lower portion of insulator 108 in FIG. 3 is configured to facilitate the formation of chamber 30. When shroud 12 is attached to probe arm 110, probe 106 extends in non-contacting relation through passage 20 with distal end 112 of probe 106 positioned on a side thereof opposite chamber 30.

Figure 6:
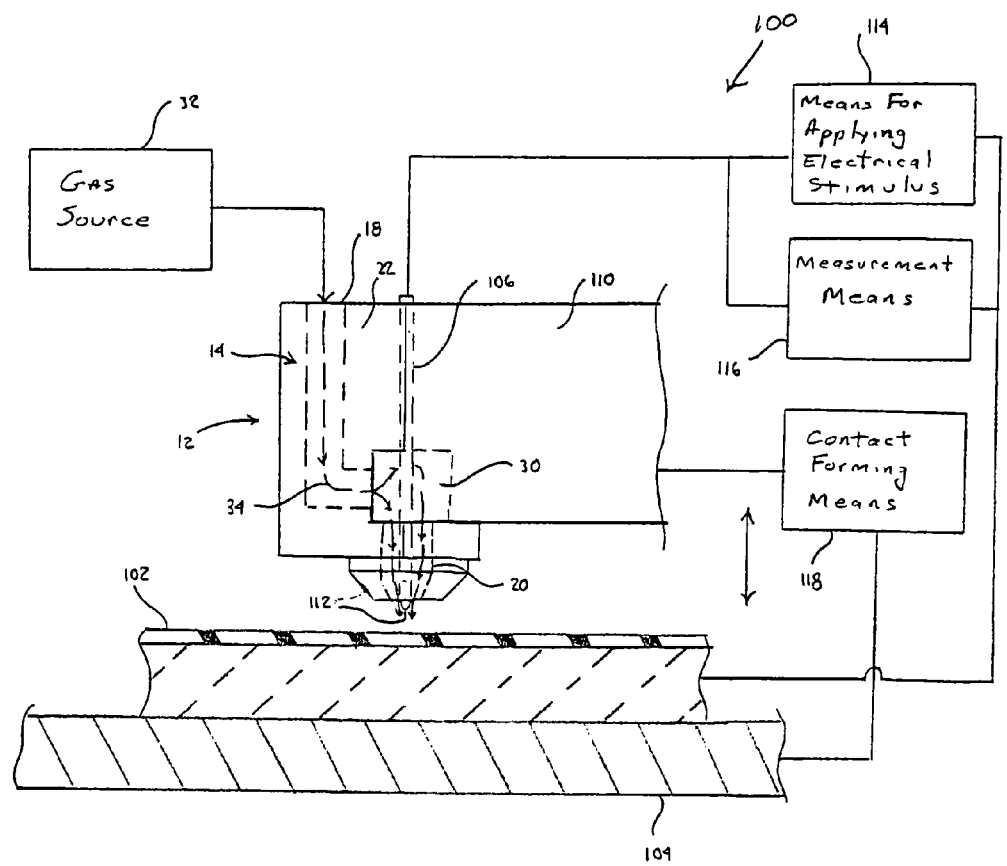
FIG. 6 is a schematic view of the shroud and probe arm in FIG. 5 in operation with the system shown in FIG. 1.

With reference to FIGS. 5–6, and with continuing reference to FIGS. 1–4, a gas source 32 coupled in fluid communication with inlet passage 18 of body 14 causes gas 34 to flow through inlet passage 18 into chamber 30 thereby surrounding the portion of probe 106 in chamber 30 with gas 34. Gas 34 entering chamber 30 exits chamber 30 via outlet passage 20 whereupon gas 34 flows by distal end 112 of probe 106. The flow of gas 34 by distal end 112 of probe 106 modifies the environment therearound to achieve the removal and/or prevention of contamination on distal end 112 of probe 106.

The environment may be modified in various manners. For example, the relative humidity in the environment may be reduced and one or more contaminants may be removed from the environment by the flow of gas 34. In addition, water may be evaporated from the environment, and a contaminated vapor may also be evaporated from the environment. The contaminant may be a contaminated vapor or any number of undesirable compounds. A schematic showing the use of system 100 and shroud 12 is illustrated in FIG. 6.

The flow of gas 34 can be controlled to provide a continual flow of gas 34 through chamber 30. This flow of gas 34 may be a laminar or turbulent. Further, gas 34 can be injected into passage 18 by a convection means 24 known in the art, e.g., fittings, hoses, nozzles, etc. Desirably, gas 34 is an inert gas, such as nitrogen, argon, purified nitrogen, purified argon, etc. The flow of gas 34 through passage 18, chamber 30 and outlet passage 20 may be controlled. Probe 106 may be a semiconductor wafer probe, an EM-gate probe, an elastic metal tip probe, etc.

Figure 7:
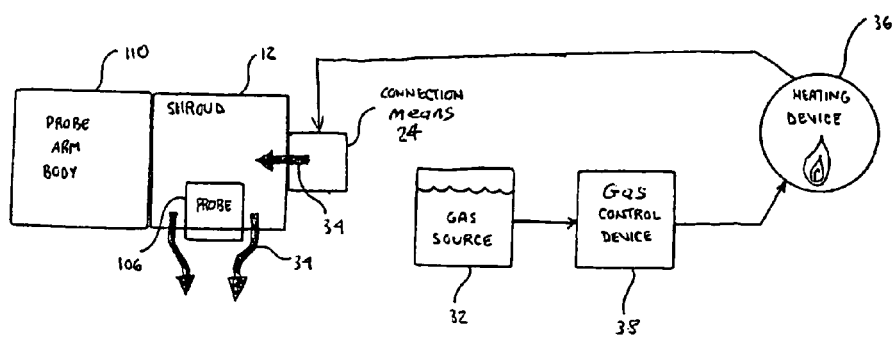
FIG. 7 is a schematic view of a further embodiment of a system according to the present invention for removing and/or preventing contamination of a probe.

With reference to FIG. 7, and with continuing reference to FIGS. 1–6, a heating device 36 can be utilized to heat gas 34 to a predetermined temperature prior to the introduction of gas 34 into chamber 30. It is envisioned that the temperature of gas 34 may be variable and controlled prior to or during injection. Heated gas 34 contacting probe 106, especially the distal end 112 of the probe 106, heats the surface of the probe 106 by convection. This heating serves to prevent and/or remove contaminants from probe 106.

A gas control device 38 can be coupled in fluid communication between gas source 32 and heating device 36 for controlling the flow and/or pressure of gas 34. Gas control device 38 can be one of a pneumatic control device, a digital control device, an analog control device, an automated control device, a manual control device, etc.

EXAMPLE

In one example of the present invention, gas 34 in the form of a heated nitrogen gas is introduced into chamber 30 via inlet passage 18. Contamination removal and/or prevention occurs, in this example, by two independent means working simultaneously. First, contamination removal is achieved through the heating of probe 106, with heating occurring primarily through the mode of forced convection, which occurs as the heated nitrogen gas flows over the surface of probe 106. The second means of contamination removal and prevention is achieved by creating a localized environment that substantially lowers the levels of humidity and other contaminating vapors. In this example, this is achieved through the use of highly purified nitrogen gas, preferably over 99% pure, which displaces the ambient atmosphere around the distal end 112 of probe 106. Since the nitrogen gas is obtained from the liquid or gas nitrogen vessel or from a nitrogen generator, this nitrogen contains almost no water vapor or organics. Therefore, independent of the heat aspect, the localized flow of nitrogen gas will create an environment that tends to evaporate water and organic contamination. In addition, contamination removal rates will be increased according to the present method, since, in this example, contamination removal does not rely solely on unaided diffusion or solely on natural convection principles. Instead, the flow of gas across the distal end 112 of probe 106 is maintained. This accelerates the time needed for probe 106 to achieve equilibrium with the heated nitrogen environment.

The present invention provides a method and apparatus for removing and/or preventing contamination of a surface of probe 106, which is deposited from the atmosphere. With respect to EM-gate probes, the present invention allows such probes to be readied for sensitive electrical measurements. By using one or both of the environment modification and heating aspects of the present invention, contamination removal is achieved. Increased contamination removal rates are realized from forced convection. However, when not in use, flow can be shut off, which minimizes undesirable heating of the ambient environment.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of removing and/or preventing contamination of a surface of a semiconductor wafer or sample probe, comprising:
   (a) positioning at least a portion of the semiconductor wafer or sample probe in a chamber having an inlet passage and an outlet passage, with a distal end of the semiconductor wafer or sample probe extending through the outlet passage and terminating outside the chamber; and
   (b) causing a gas to flow through the inlet passage into the chamber and out of the outlet passage, thereby modifying an environment surrounding the distal end of the semiconductor wafer or sample probe, wherein the gas flowing out of the outlet passage flows by an exterior surface of the semiconductor wafer or sample probe.

2. The method of claim 1, wherein the modifying of step (b) includes at least one of:
   (i) reducing the relative humidity in the environment;
   (ii) removing at least one contaminant from the environment;
   (iii) evaporating water in the environment; and
   (iv) evaporating contaminated vapor in the environment.

3. The method of claim 2, wherein the at least one contaminant is a contaminated vapor.

4. The method of claim 1, wherein the flow of gas is one of laminar flow and turbulent flow.

5. The method of claim 1, wherein the gas is heated to a predetermined temperature.

6. The method of claim 5, wherein the temperature is variable.

7. The method of claim 1, wherein the gas is an inert gas.

8. The method of claim 1, further comprising the step of controlling the flow of gas through at least one of the inlet passage, the chamber and the outlet passage.

9. A method of removing and preventing contamination of a surface of a semiconductor wafer or sample probe, comprising:
   (a) positioning at least a portion of the semiconductor wafer or sample probe in a chamber having an inlet passage and an outlet passage, with a distal end of the semiconductor wafer or sample probe extending through the outlet passage and terminating outside the chamber;
   (b) heating a gas; and
   (c) causing the heated gas to flow through the inlet passage into the chamber and out the outlet passage whereupon the heated gas contacts an exterior surface of the semiconductor wafer or sample probe in the outlet passage and the distal end of the semiconductor wafer or sample probe.

10. The method of claim 9, wherein step (c) further comprises at least one of:
   (i) reducing the relative humidity in the environment;
   (ii) removing at least one contaminant from the environment;
   (iii) evaporating water in the environment; and
   (iv) evaporating contaminated vapor in the environment.

11. The method of claim 10, wherein the at least one contaminant is a contaminated vapor.

12. The method of claim 9, wherein the flow of gas is one of laminar flow and turbulent flow.

13. The method of claim 9, wherein the gas is heated to a predetermined temperature.

14. The method of claim 9, wherein the temperature of the heated gas is variable.

15. The method of claim 9, wherein the gas is an inert gas.

16. The method of claim 9, further comprising controlling at least one of the flow of gas and the gas heating.

17. A system for removing and preventing contamination of a surface of a semiconductor wafer or sample probe extending through an insulator and attached to a probe arm, the system comprising:
   a shroud, including (i) a body defining a wall, wherein the wall, the insulator and the probe arm define a chamber through which the semiconductor wafer or sample probe extends, (ii) an inlet passage extending through the wall and in fluid communication with the chamber, and (iii) an outlet passage extending through a base of the body and in fluid communication with the chamber; and
   a gas source in fluid communication with the inlet passage of the body and configured to cause a gas to flow through the inlet passage into the chamber and out the outlet passage via an exterior surface of the semiconductor wafer or sample probe which extends through the outlet passage and terminates outside the chamber.

18. The system of claim 17, wherein the gas source is at least one of a liquid gas vessel, a gas vessel and a gas generator.

19. The system of claim 17, further comprising means for connecting the gas source and the inlet passage.

20. The system of claim 19, wherein the means for connecting is at least one of a fitting, a hose, a nozzle and a gas injection fitting.

21. The system of claim 17, further comprising a heating device configured to heat the gas to a predetermined temperature prior to the gas following into the chamber.

22. The system of claim 17, further comprising a gas control device in communication with the gas source and configured to control at least one of the flow and the pressure of the gas to the chamber.

23. The system of claim 22, wherein the gas control device is at least one of a pneumatic control device, a digital control device, an analog control device, an automated control device and a manual control device.

24. The system of claim 17, further including a flow control device in fluid communication with the inlet passage and configured to provide controlled, directional flow of the gas to the chamber.

25. The system of claim 17, wherein the gas is an inert gas.

26. The system of claim 17, wherein the shroud is removably coupled to the probe arm.

27. The system of claim 17, wherein a distal end of the semiconductor wafer or sample probe extends through the outlet passage and terminates on a side thereof opposite the chamber.

28. A shroud for removing and preventing contamination of a surface of a semiconductor wafer or sample probe, the shroud comprising:
   a body defining a wall and a base;
   an inlet passage extending through the body and debouching through the wall; and
   an outlet passage extending through the base, wherein, in use of the shroud, the wall defines a wall of a chamber in which at least part of the semiconductor wafer or sample probe is positioned with the distal end of the semiconductor wafer or sample probe extending through the outlet passage and terminating outside the chamber.

29. The shroud of claim 28, further comprising an orifice extending through the body and configured to accept a fastener for removably attaching the shroud to a probe arm.

* * * * *